United States Patent
Adachi et al.

(10) Patent No.: US 8,408,253 B2
(45) Date of Patent: Apr. 2, 2013

(54) NOZZLE

(75) Inventors: Naruto Adachi, Aichi (JP); Kaname Takai, Aichi (JP)

(73) Assignee: Murata Machinery, Ltd., Kyoto (JP)

( * ) Notice: Subject to any disclaimer, the term of this patent is extended or adjusted under 35 U.S.C. 154(b) by 783 days.

(21) Appl. No.: 12/538,490

(22) Filed: Aug. 10, 2009

(65) Prior Publication Data

US 2010/0032050 A1 Feb. 11, 2010

(30) Foreign Application Priority Data

Aug. 11, 2008 (JP) ................... 2008-207392

(51) Int. Cl.
*B65B 31/00* (2006.01)
(52) U.S. Cl. .................... 141/54; 141/113; 141/310
(58) Field of Classification Search ............. 141/4, 37, 141/46, 54, 113, 285, 310; 206/710
See application file for complete search history.

(56) References Cited

U.S. PATENT DOCUMENTS

| 2003/0170988 A1 | 9/2003 | Izumi et al. | |
|---|---|---|---|
| 2007/0151620 A1 * | 7/2007 | Okabe | 141/63 |

FOREIGN PATENT DOCUMENTS

| EP | 1 335 412 | 8/2003 |
|---|---|---|
| EP | 1 391 944 | 2/2004 |
| JP | 2001-31212 | 2/2001 |
| JP | 2003-257845 | 9/2003 |
| JP | 2005-167168 | 6/2005 |
| WO | 98/29178 | 7/1998 |
| WO | 99/02921 | 1/1999 |

OTHER PUBLICATIONS

European Search Report (in English language) issued Feb. 19, 2010 in corresponding European Patent Application No. 09 16 7523.

* cited by examiner

*Primary Examiner* — Gregory Huson
*Assistant Examiner* — Jason K Niesz
(74) *Attorney, Agent, or Firm* — Wenderoth, Lind & Ponack, L.L.P.

(57) ABSTRACT

A nozzle that can introduce gas into containers placed at a predetermined interval. The nozzle introduces gas into the container without contacting the container, and includes a main opening where the gas at a first flow rate is discharged and a sub-opening where the gas at a second flow rate is discharged in a same direction as the direction of the gas discharged from the main opening.

5 Claims, 4 Drawing Sheets

NOZZLE

BACKGROUND OF THE INVENTION (1) Field of the Invention

The present invention relates to a nozzle that introduces gas into a container for purging the inside of the container, and particularly relates to a nozzle that introduces gas without contacting the container.

(2) Description of the Related Art

In the manufacture of semiconductor devices such as LSI, wafers, glass substrates, reticles and the like, the devices need to be stored such that they are not deteriorated or degenerated. For example, the wafers need to be stored in a low oxygen atmosphere to prevent oxidization, and the reticles need to be stored in an atmosphere where moisture ($H_2O$) is removed in order to suppress the growth of haze. Further, it is necessary to avoid the particles (fine dust) from adhering to the wafers and others as much as possible. For this reason, in many cases, the wafers are stored in a container filled with a clean gas composed of a type of gas suitable for the stored object.

However, as disclosed in Japanese Unexamined Patent Application Publication No. 2001-31212, there are cases where it is necessary to sort the stored wafers into multiple containers. In such a case, it is necessary to open the containers. Thus, a process known as "purging" is performed in order to maintain the high degree of cleanliness of the container by introducing clean gas into the open container to keep the pressure in the container more positive than the atmosphere outside of the container.

Furthermore, it has been considered that storing the reticles and others in a container where the purging is constantly performed causes less contamination of the reticles and others than storage in a sealed container, since the reticles and others are stored for a relatively long period of time. Accordingly, there are purge apparatuses which can constantly purge the container with clean gas.

However, it is known that the stored wafers and reticles are contaminated with particles on rare occasions, even when a conventional purge apparatus is used. After devoted research and diligent effort, the inventors of the present invention have reached the finding that the rare contaminations with the particles are caused by the purge apparatus. Furthermore, the inventors also discovered that, since the container placed in the purge apparatus and the nozzle, which discharges the gas into the container, contact each other, the friction and impact between the container and the nozzle form particles; and the particles subsequently contaminate the inside of the container.

SUMMARY OF THE INVENTION

The present invention has been conceived in view of the above findings, and it is an object of the present invention to provide a nozzle which can introduce gas into a container efficiently, while introducing the gas into the container without contacting the container to prevent the particles from being formed.

In order to solve the problem, the nozzle according to the present invention is a nozzle which introduces gas into a container without contacting the container. The nozzle comprises a main opening where gas at a first flow rate is discharged; and a sub-opening which has a collar-shape surrounding the main opening, and where gas at a second flow rate is discharged in the same direction as the direction of the gas discharged from the main opening.

This forms an air curtain around the main opening with the gas discharged from the sub-opening. Accordingly, it is possible to avoid the gas discharged from the main opening from leaking from the gap between the nozzle and the container expeditiously, allowing efficient introduction of the gas into the container.

According to the present invention, even when the container is repeatedly attached to and detached from the nozzle for purging the inside of the container, particles are not formed due to the contact of the container and the nozzle. Furthermore, it is possible to efficiently introduce the gas discharged from the nozzle into the container, which suppresses the amount of wasted gas.

FURTHER INFORMATION ABOUT TECHNICAL BACKGROUND TO THIS APPLICATION

The disclosure of Japanese Patent Application No. 2008-207392 filed on Aug. 11, 2008 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENT(S)

The following is the description of the embodiments of the present invention with reference to the drawings.

First Embodiment

Figure 1A:
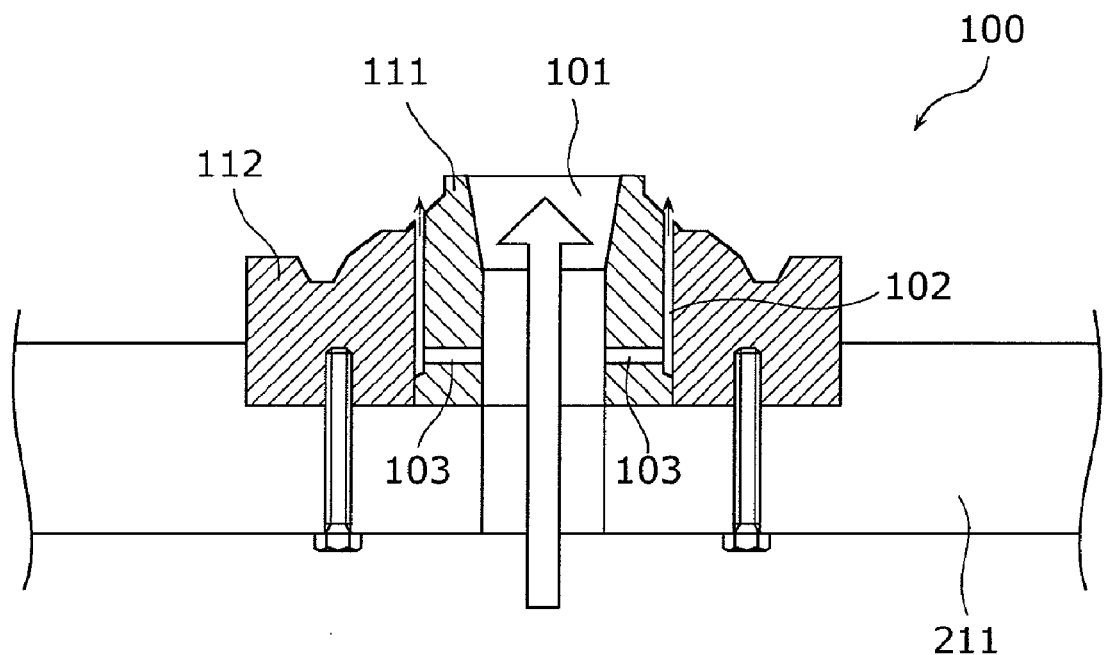
FIG. 1A is a cross-sectional view of a nozzle constructed in accordance with a first embodiment of the present invention.
Figure 1B:
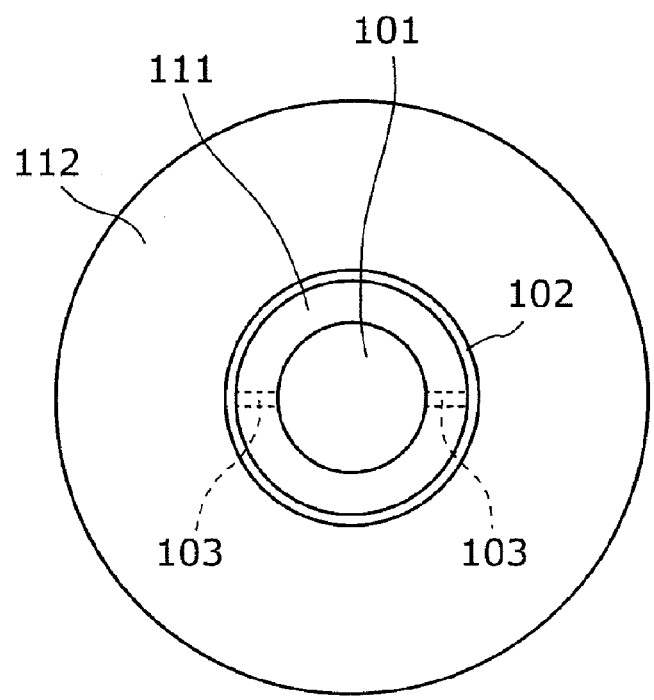
FIG. 1B is a top view of the nozzle shown in FIG. 1.

FIG. 1A is a cross-sectional view of a nozzle constructed in accordance with an embodiment of the present invention, and FIG. 1B is a top view of the nozzle shown in FIG. 1A.

As shown in these drawings, the nozzle 100 includes a main opening 101, a sub-opening 102, a through-hole 103, a main tube 111, and a sub-tube 112.

The main tube 111 is a member which includes the main opening 101, and is a tube-shaped member where the gas for purging flows. In the first embodiment, the main tube 111 has a cylindrical shape, and the hollow part functions as the main opening 101.

The sub-opening 112 is a tube-shaped member arranged to surround the main tube 111, and to define a gap with the main tube 111. Furthermore, the gap formed between the sub-tube 112 and the main tube 111 functions as the sub-opening 102. In the first embodiment, the sub-tube 112 is a cylinder forming a concentric circular structure relative to the main tube 111, and having an inner diameter slightly larger than the outside diameter of the main tube 111. Furthermore, a flange slightly projecting in the radial direction is formed at an end of the main tube 111; and the spatial relationship of the sub-tube 112 with respect to the main tube 111 is fixed by engagement with the flange. Accordingly, the gap, which functions as the sub-opening 102, is maintained between the main tube 111 and the sub-tube 112, which surrounds the main tube 111 with a predetermined width.

Here, when gas at the same pressure is introduced into the main opening 101 and the sub-opening 102, the width of the sub-opening 102 is determined such that a second flow rate which is the flow rate of the gas discharged from the sub-opening 102 is smaller than a first flow rate which is the flow rate of the gas discharged from the main opening 101. More specifically, the preferable width of the sub-opening 102 is approximately around 2.5% of the diameter of the main opening 101. For example, the preferable width of the sub-opening 102 is approximately 0.1 mm, when the diameter of the main opening 101 is 4 mm.

The through-hole 103 is a hole for introducing a part of the gas flowing in the main opening 101 into the sub-opening 102. In the first embodiment, the through-hole 103 is formed so as to pass through the wall of the main tube 111 from the main opening 101 to the sub-opening 102.

The through-hole 103 separates the gas passing though the main opening 101 (shown in the arrow in FIG. 1A), and part of the gas is discharged from the sub-opening 102. Accordingly, only one path for supplying the gas is required, and thus it is possible to produce the effect of the present invention while suppressing the increase in cost.

Next, the usage of the nozzle 100 is described.

Figure 2:
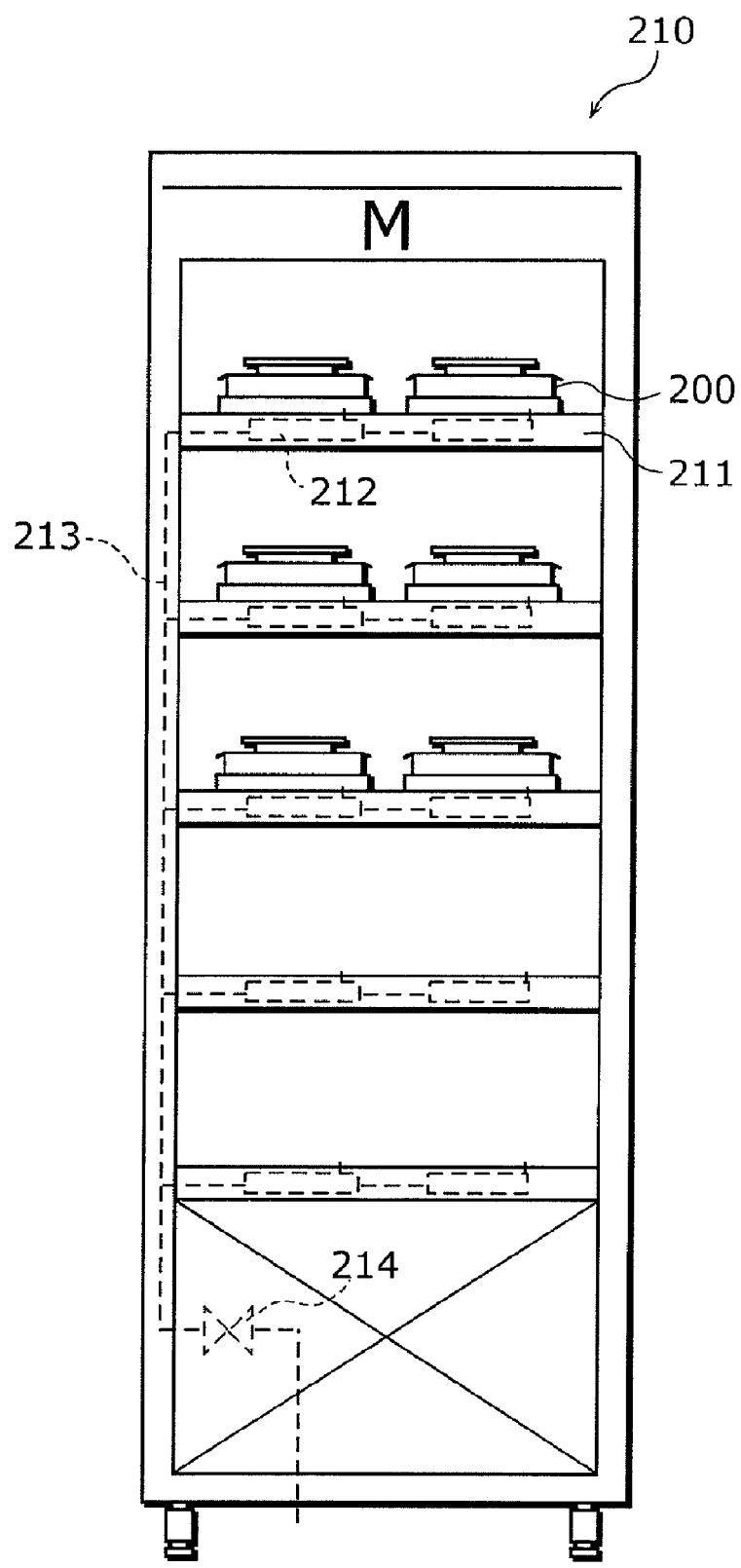
FIG. 2 is a front elevational view of a purge apparatus with a nozzle.

FIG. 2 is a front elevational view of a purge apparatus with a nozzle.

As shown in FIG. 2, the purge apparatus 210 can purge the inside of the container 200 by discharging clean gas from the nozzle 100 corresponding to the container 200, when the container 200 is placed thereon. The purge apparatus 210 is a rack-shaped apparatus including shelf plates 211 on which multiple containers 200 can be placed. The purge apparatus 210 is provided with discharge units 212 with the nozzles 100 inside the shelf plates 211 corresponding to the positions where the containers 200 are placed. Each discharge unit 212 is connected to a pipe 213 to which the gas is guided. The pipe 213 is attached to a main valve 214 which roughly adjusts the flow rate of gas to be supplied to each discharge unit 212.

The discharge unit 212 can detect whether or not the container 200 is placed on a predetermined position on the shelf plate 211, and can discharge the gas from the nozzle 100 when the container 200 is detected.

Figure 3:
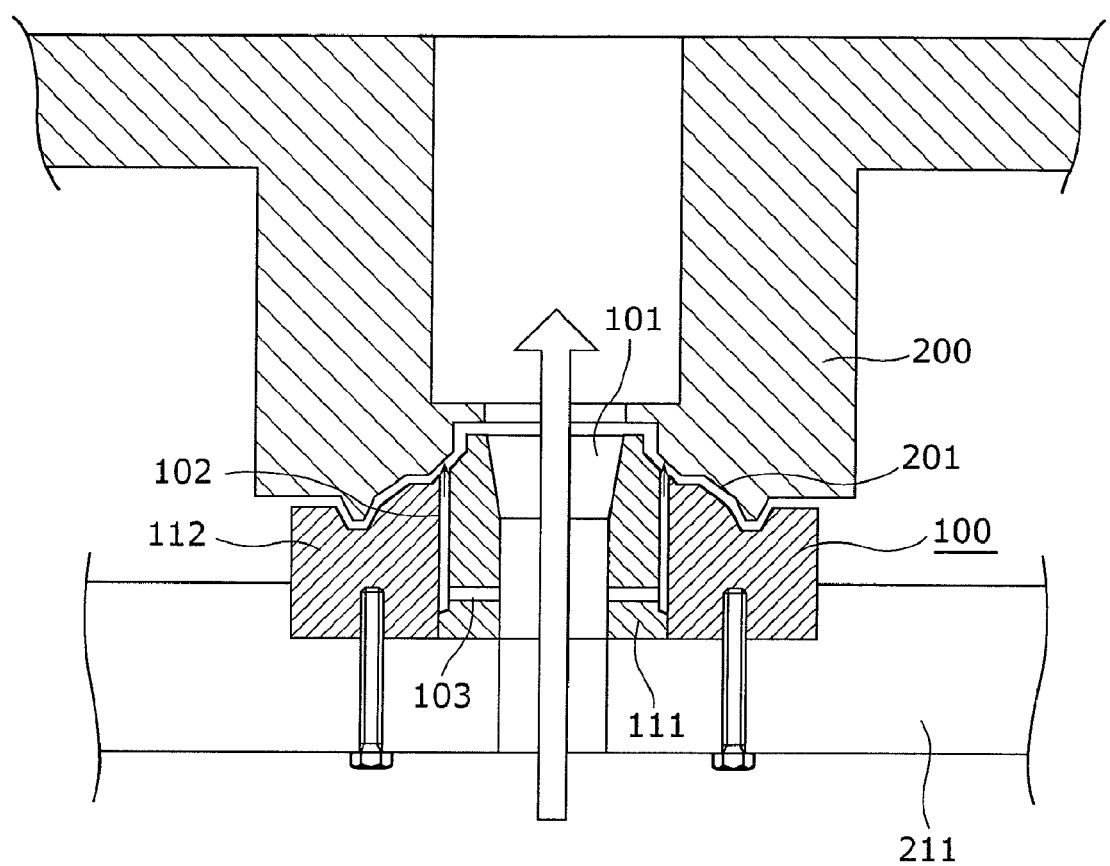
FIG. 3 is a cross-sectional view schematically showing a connecting part of the nozzle and a container.

FIG. 3 is a cross-sectional view schematically showing a connecting part of the purge apparatus composed of the nozzle and the container.

As shown in FIG. 3, in the purge apparatus, a slight gap is formed between the nozzle 100 and the container 200 when the nozzle 100 and the container 200 are connected. The gap is formed by the container 200 and the shelf plate 211 contacting each other.

The container 200 includes a guide 201 which is tapered in shape, at a location where the gas discharged from the sub-opening 102 hits.

The guide 201 can guide the gas discharged from the sub-opening 102 in a direction of the gas discharged from the main opening 101, and functions like a reflector which reflects the gas discharged from the sub-opening 102 towards the gas discharged from the main opening 101. With this structure, most of the gas discharged from the sub-opening 102 is introduced into the container 200 together with the gas discharged from the main opening 101, while pressing the gas discharged from the main opening 101.

Here, the discharge unit 212 detects that the container 200 is placed, and causes the gas at the first flow rate to be discharged from the main opening 101 of the nozzle 100. A portion of the gas flowing in the main opening 101 is introduced into the sub-opening 102 via the through-hole 103, and is discharged from the sub-opening 102 at the second flow rate. The gas discharged from the sub-opening 102 forms a thin layer of gas flow surrounding the main opening 101. The layer of gas flow is formed in the gap between the nozzle 100 and the container 200, and exists as if to seal the gap between the nozzle 100 and the container 200. This prevents leakage of the gas discharged from the main opening 101 from the gap between the nozzle 100 and the container 200, and most of the gas is introduced into the container 200. Note that, the part of the gas discharged from the sub-opening 102 leaks from the gap between the nozzle 100 and the container 200. However, the second flow rate of the gas discharged from the sub-opening 102 is smaller than the first flow rate of the gas discharged from the main opening 101. Accordingly, it is possible to prevent the amount of leaking gas as a whole, which allows efficient introduction of the gas into the container even when there is a gap between the nozzle 100 and the container 200.

Second Embodiment

Next, another embodiment according to the present invention will be described.

Figure 4A:
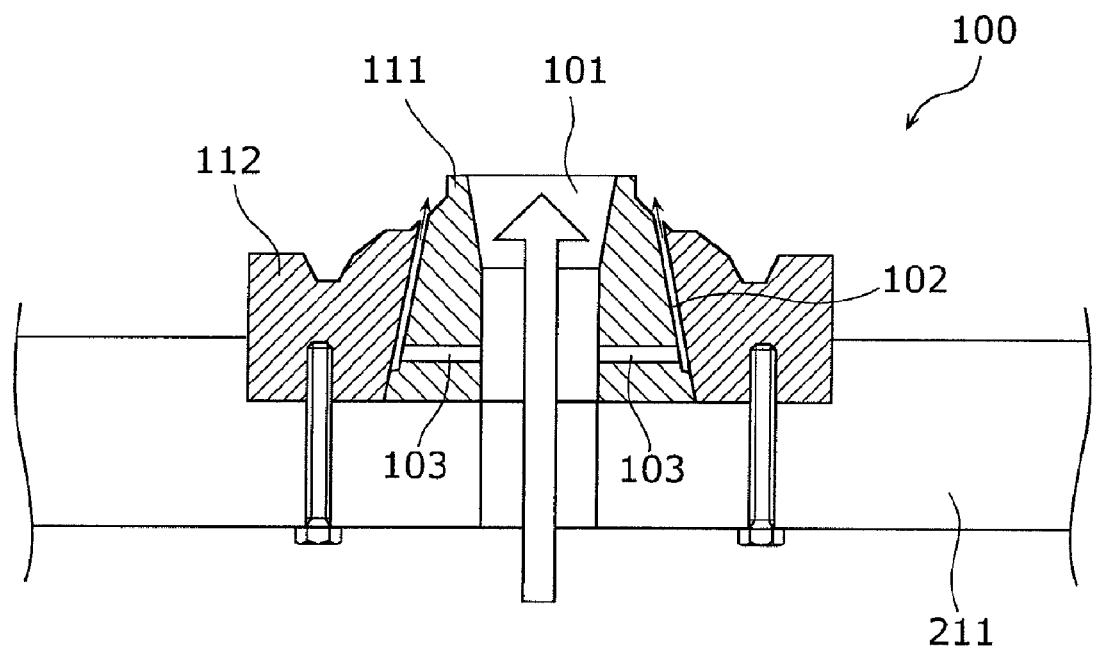
FIG. 4A is a cross-sectional view of a nozzle constructed in accordance with a second embodiment of the present invention.
Figure 4B:
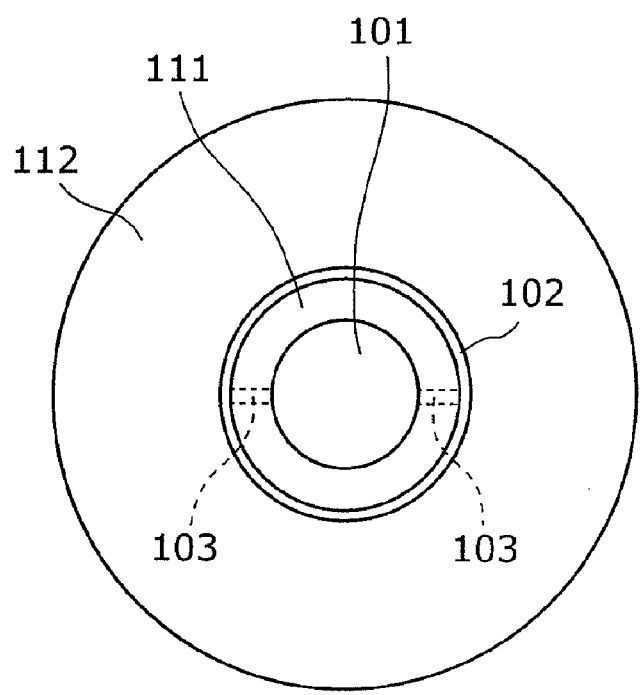
FIG. 4B is a top view of the nozzle shown in FIG. 4A.

FIG. 4A is a cross-sectional view of a nozzle constructed in accordance with a second embodiment of the present invention, and FIG. 4B is a top view of the nozzle shown in FIG. 4A.

As shown in these drawings, the nozzle 100 includes a main opening 101, a sub opening 102, a through-hole 103, a main tube 111, and a sub tube 112.

The external form of the main tube 111 has a circular truncated cone-shape, and the main opening 101 is provided so as to be concentric with the central axis of the main tube 111.

The sub-tube 112 is a tube-shaped member including a circular truncated cone-shaped hole corresponding to the external form of the main tube 111. Furthermore, the gap formed between the sub-tube 112 and the main tube 111 functions as the sub-opening 102.

The sub-opening 102 has a tapered shape where the tip comes closer to the main opening 101 such that the sub-opening 102 can discharge the gas toward the main opening 101. More specifically, the sub-opening 102 has a shape where the diameter gradually decreases towards the tip.

The abovementioned shape of the sub-opening 102 suppresses the amount of gas discharged from the sub-opening 102 from leaking through the gap between the nozzle 100 and the container 200. Therefore, it is possible to introduce the gas into the container 200 more efficiently as a whole.

Note that the gas is gas used for purging the container 200, and the type of gas is not particularly limited. For example, when the container 200 to be purged is a container 200 for holding reticles, clean, dry air is suitable for the gas to be used. This is because the reticles have a small risk of oxidation caused by air. Furthermore, when the container 200 to be purged is a container 200 for holding wafers, an inert gas such as nitrogen is suitable for the gas to be used. This is because the wafers have a high risk of oxidization. The clean gas refers to gas which has zero or a small number of particles per unit volume in the gas. The gas may be a gas such as air where several types of gasses are mixed, and may also be gas composed of a single type of gas.

Note that, "opening" referred to as the main opening 101 and the sub-opening 102 in the claims and the specification is a part which determines the direction of the gas being discharged. In other words, the term "opening" is used in a three-dimensional concept, not in a two-dimensional concept. Accordingly, the description "the opening has a taper-shape" indicates the three-dimensional circular space, whose diameter gradually decreases, and the main tube 111 and the sub-tube 112 define the circular space.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

The present invention is applicable to a nozzle which introduces clean gas into a container for storing objects that need to avoid contamination by the particles, such as the reticles, the wafers, and the glass substrates for display apparatuses.

What is claimed is:

1. A purge apparatus comprising:
    a container to be purged, the container being adapted to store an object therein; and
    a nozzle which introduces gas into the container without contacting the container, wherein the nozzle includes:
    a main opening where the gas at a first flow rate is discharged; and
    a sub-opening which has a collar-shape surrounding said main opening, and where the gas at a second flow rate is discharged in a same direction as a direction of the gas discharged from said main opening, and
    the container includes a guide which guides the gas discharged from said sub-opening in a direction of the gas discharged from said main opening.

2. The purge apparatus according to claim 1, wherein said sub-opening is angled inwardly toward said main opening.

3. The purge apparatus according to claim 1, wherein said nozzle further comprises at least one through-hole communicating said main opening with said sub-opening.

4. The purge apparatus according to claim 1, wherein said main opening is defined by a cylindrical main tube, and said sub-opening is defined by a sub-tube surrounding said main tube so as to form a gap between said main tube and said sub-tube.

5. The purge apparatus according to claim 4, wherein said nozzle further comprises at least one through-hole formed in said main tube so as to communicate said main opening with said sub-opening.

* * * * *